(12) United States Patent
Hsu et al.

(10) Patent No.: US 11,294,425 B2
(45) Date of Patent: Apr. 5, 2022

(54) PORTABLE ELECTRONIC DEVICE

(71) Applicant: GETAC TECHNOLOGY CORPORATION, Hsinchu County (TW)

(72) Inventors: Wan-Lin Hsu, Taipei (TW); Juei-Chi Chang, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 41 days.

(21) Appl. No.: 16/893,375

(22) Filed: Jun. 4, 2020

(65) Prior Publication Data
US 2021/0059061 A1 Feb. 25, 2021

Related U.S. Application Data

(60) Provisional application No. 62/889,266, filed on Aug. 20, 2019.

(51) Int. Cl.
| | |
|---|---|
| *G06F 1/16* | (2006.01) |
| *H05K 5/02* | (2006.01) |
| *H05K 5/03* | (2006.01) |
| *H02G 11/00* | (2006.01) |
| *H02G 15/10* | (2006.01) |
| *H02G 15/18* | (2006.01) |

(Continued)

(52) U.S. Cl.
CPC .......... *G06F 1/1616* (2013.01); *G06F 1/1656* (2013.01); *G06F 1/183* (2013.01); *H02G 11/00* (2013.01); *H02G 15/10* (2013.01); *H02G 15/18* (2013.01); *H05K 5/023* (2013.01); *H05K 5/03* (2013.01); *H05K 7/02* (2013.01); *H05K 7/1417* (2013.01)

(58) Field of Classification Search
CPC ...... G06F 1/1616; G06F 1/1656; G06F 1/183; G06F 1/187; G06F 1/1658; H02G 11/00; H02G 15/10; H02G 15/18; H05K 7/02; H05K 7/1417; H05K 5/023; H05K 5/03
See application file for complete search history.

(56) References Cited

U.S. PATENT DOCUMENTS 1,495,752 A * 5/1924 La Rue ................. A47B 95/02
  16/405
2,168,077 A * 8/1939 Wheary ................ A45C 13/26
  16/405

(Continued)

*Primary Examiner* — Anthony M Haughton
*Assistant Examiner* — Theron S Milliser

(57) ABSTRACT

A portable electronic device includes a main body, two casings and a handle unit. The main body includes a board portion with two ends extending to form two extension portions. The board portion and extension portions together form a recess. The casings are demountably fixed to the extension portions. The casings and the main body together form a movement space and a protruding post. The handle unit includes a gripping member and two movement elements. The movement elements are movably disposed at two ends of the gripping member. The movement elements each have a guiding through hole for fitting around a column of the main body. The gripping member is operable to switch between an opened position and a shut position relative to the main body because of the movement elements. The handle unit separates from the main body when the casings are removed from the main body.

14 Claims, 18 Drawing Sheets

(51) Int. Cl.
*H05K 7/02* (2006.01)
*H05K 7/14* (2006.01)
*G06F 1/18* (2006.01)

(56) References Cited

U.S. PATENT DOCUMENTS

| | | | | |
|---|---|---|---|---|
| 3,168,173 | A * | 2/1965 | Koffler | A45C 13/26 16/405 |
| 3,438,467 | A * | 4/1969 | Milette | A45C 13/26 16/405 |
| 3,447,196 | A * | 6/1969 | Szabo | A45C 13/26 16/405 |
| 3,795,941 | A * | 3/1974 | Szabo | A45C 13/26 16/405 |
| 4,002,386 | A * | 1/1977 | McKenzie | A47B 95/02 312/332.1 |
| 4,901,261 | A * | 2/1990 | Fuhs | G06F 1/1616 361/679.09 |
| 5,152,496 | A * | 10/1992 | Kobayashi | B60R 11/02 248/27.1 |
| 5,351,508 | A * | 10/1994 | Kelley | E05B 73/0005 16/445 |
| 6,032,334 | A * | 3/2000 | Iima | A45C 13/22 16/405 |
| 6,097,592 | A * | 8/2000 | Seo | G06F 1/1616 248/351 |
| 7,576,981 | B2 * | 8/2009 | Kuo | E05B 73/0005 361/679.57 |
| 7,712,590 | B1 * | 5/2010 | Lee | A45C 13/26 190/115 |
| 7,936,562 | B2 * | 5/2011 | Nagamura | G06F 1/1656 361/679.59 |
| 8,015,669 | B2 * | 9/2011 | Huang | A45F 5/10 16/405 |
| 8,353,082 | B2 * | 1/2013 | Naukkarinen | H04M 1/022 16/354 |
| 8,496,210 | B2 * | 7/2013 | Chang | H05K 5/023 248/27.3 |
| 8,670,233 | B2 * | 3/2014 | Huang | G06F 1/1613 361/679.59 |
| 8,752,249 | B1 * | 6/2014 | Tsai | E05D 3/18 16/357 |
| 9,253,903 | B2 * | 2/2016 | Kawada | H05K 5/0217 |
| 10,019,037 | B2 * | 7/2018 | Lee | G06F 1/1656 |
| 10,606,311 | B2 * | 3/2020 | Shindo | G06F 1/1637 |
| 10,935,183 | B2 * | 3/2021 | Zhong | F16M 13/005 |
| 11,039,680 | B2 * | 6/2021 | Chou | A45C 13/22 |
| 11,099,610 | B1 * | 8/2021 | Chung | G06F 1/1684 |
| 2010/0046154 | A1 * | 2/2010 | Nagamura | G06F 1/1616 361/679.21 |
| 2010/0053888 | A1 * | 3/2010 | Nagamura | G06F 1/1656 361/679.59 |
| 2011/0317345 | A1 * | 12/2011 | Huang | G06F 1/1613 361/679.01 |
| 2012/0236474 | A1 * | 9/2012 | Chang | G06F 1/181 361/679.01 |
| 2017/0293320 | A1 * | 10/2017 | Shindo | G06F 1/166 |
| 2017/0364124 | A1 * | 12/2017 | Lee | G06F 1/1656 |
| 2019/0350352 | A1 * | 11/2019 | Chou | A45C 13/26 |
| 2020/0318781 | A1 * | 10/2020 | Zhong | A45F 5/10 |
| 2021/0089088 | A1 * | 3/2021 | Lee | H05K 5/061 |

* cited by examiner

PORTABLE ELECTRONIC DEVICE

CROSS-REFERENCE TO RELATED APPLICATIONS

The present application claims the benefit of U.S. provisional Patent Application No. 62/889,266, filed on Aug. 20, 2019, the disclosure of which is hereby incorporated by reference herein in its entirety.

BACKGROUND OF THE INVENTION

Field of the Invention

The present disclosure relates to portable electronic devices and, more particularly, to a portable electronic device with a handle for users to hold the portable electronic device.

Description of the Prior Art

Rugged laptops are each equipped with a handle to render them portable. The handles are opened and shut by a linkage. Primitive handles of rugged laptops are made of aluminum-magnesium alloys, and their strokes are designed in accordance with position differences of the linkage. However, the handles thus made and designed are susceptible to fall-induced severance. Afterward, the handles are made of plastics to render the handles lightweight and insusceptible to fall-induced severance without reducing their capability. Nevertheless, the handles of common, existing rugged laptops in operation are predisposed to random jerks to the detriment of ease of use.

SUMMARY OF THE INVENTION

It is an objective of the present disclosure to provide a portable electronic device with a handle that does not jerk randomly.

In order to achieve the above and other objectives, an embodiment of the present disclosure provides a portable electronic device, comprising a main body, two casings and a handle unit. The main body comprises a board portion and two extension portions. The board portion extends laterally to form the two extension portions. The two extension portions and the board portion together define a recess. Each extension portion has a protruding post. The two casings are demountably fixed to the two extension portions. The casings and the two extension portions together define a movement space. The protruding post is disposed in the movement space. The handle unit comprises a gripping member and two movement elements. The gripping member is to be gripped by users. The two movement elements are movably disposed at two ends of the gripping member. Each movement element has at least one guiding through hole penetrable by the movement element. The guiding through holes fit around columns, respectively. The gripping member is operable to switch between an opened position and a shut position relative to the main body because of the two movement elements. A gap formed between the handle unit and the main body is wider when the handle unit is at the opened position than at the shut position.

In order to achieve the above and other objectives, another embodiment of the present disclosure provides a portable electronic device, comprising a main body and a handle unit. The handle unit comprises a gripping member, two movement elements and two handle covers. Two ends of the gripping member each have a gripping guide groove. The gripping member comprises two gripping guiding posts. The two gripping guiding posts are disposed at two said gripping guide grooves. Two ends of each movement element each have a first guiding through hole and a second guiding through hole. The first guiding through hole fits around a protruding post of the main body. The second guiding through hole fits around one of the gripping guiding posts. One end of each movement element moves relative to the main body. The other end of each movement element moves relative to the gripping member. The two handle covers are fixedly disposed at the two ends of the gripping member. The two handle covers conceal the two gripping guide grooves. Each handle cover comprises a resilient arm and a positioning member. The positioning member protrudes upward from the surface of the resilient arm. The handle unit is operable to move between an opened position and a shut position relative to the main body. The positioning member moves out of the second guiding through hole whenever the handle unit is at the opened position. The positioning member moves into the second guiding through hole whenever the handle unit is at the shut position. During the movement of the handle unit from the opened position to the shut position, the gripping guiding posts and the movement elements move relative to each other, such that the movement elements push the positioning member, and the resilient arm deforms resiliently, thereby allowing the positioning member to move from beyond the second guiding through hole into the second guiding through hole. During the movement of the handle unit from the shut position to the opened position, the gripping guiding posts and the movement elements move relative to each other, the movement elements push the positioning member, and the resilient arm deforms resiliently, thereby allowing the positioning member to move out of the second guiding through hole.

In conclusion, a portable electronic device of the present disclosure comprises guiding posts, resilient arms and positioning members whereby a gripping member is prevented from jerking randomly. Further a malfunctioning handle unit can be easily changed, by separating two casings from a main body.

The technical features of the present disclosure are depicted by accompanying drawings and described below. However, the accompanying drawings and the description are illustrative of the present disclosure rather than restrictive of the scope of the claims of the present disclosure.

DETAILED DESCRIPTION OF THE EMBODIMENTS

The accompany drawings of the present disclosure serve an illustrative, rather than restrictive, purpose.

Figure 1:
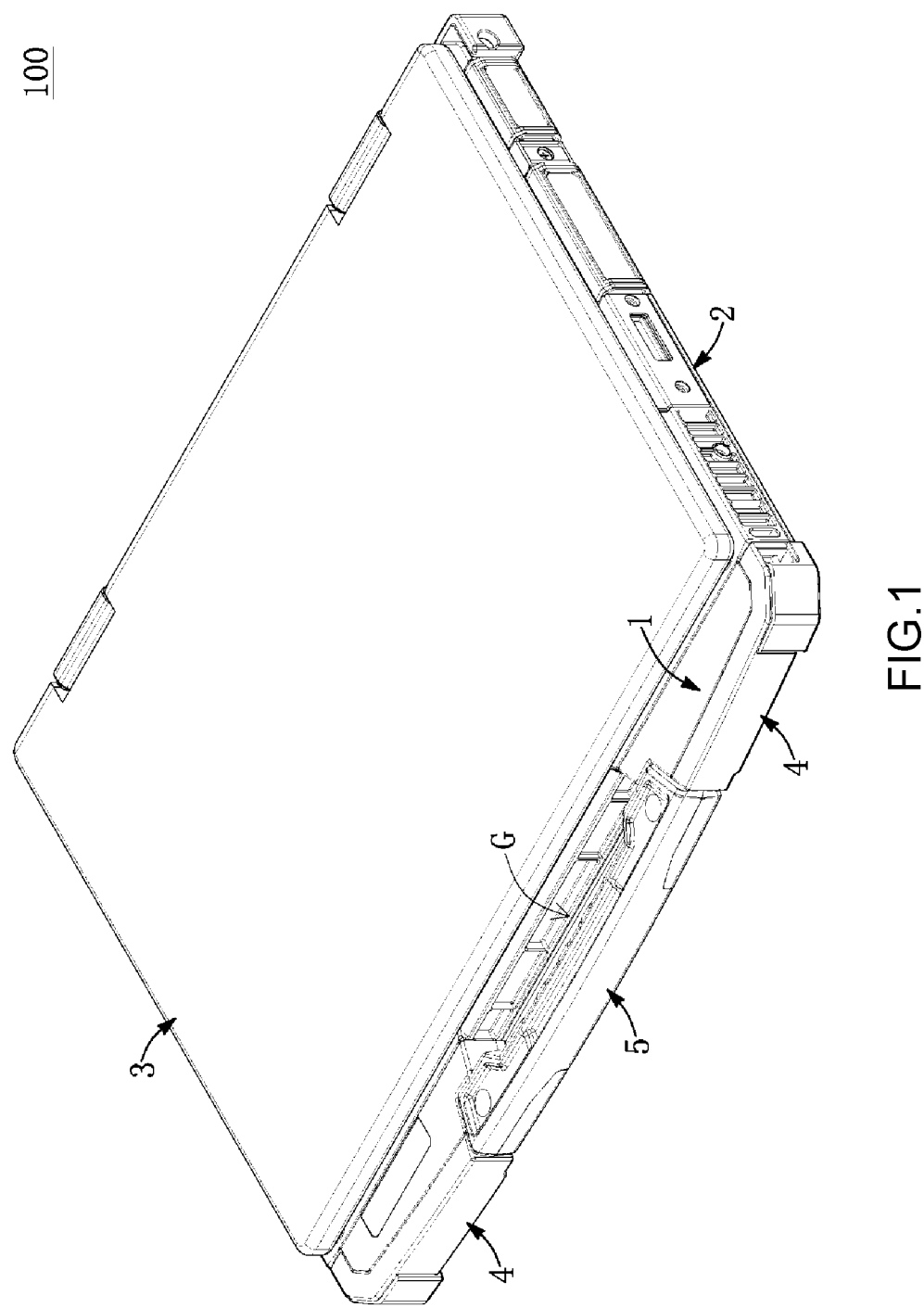
FIG. 1 is a perspective view of a portable electronic device of the present disclosure.
Figure 2:
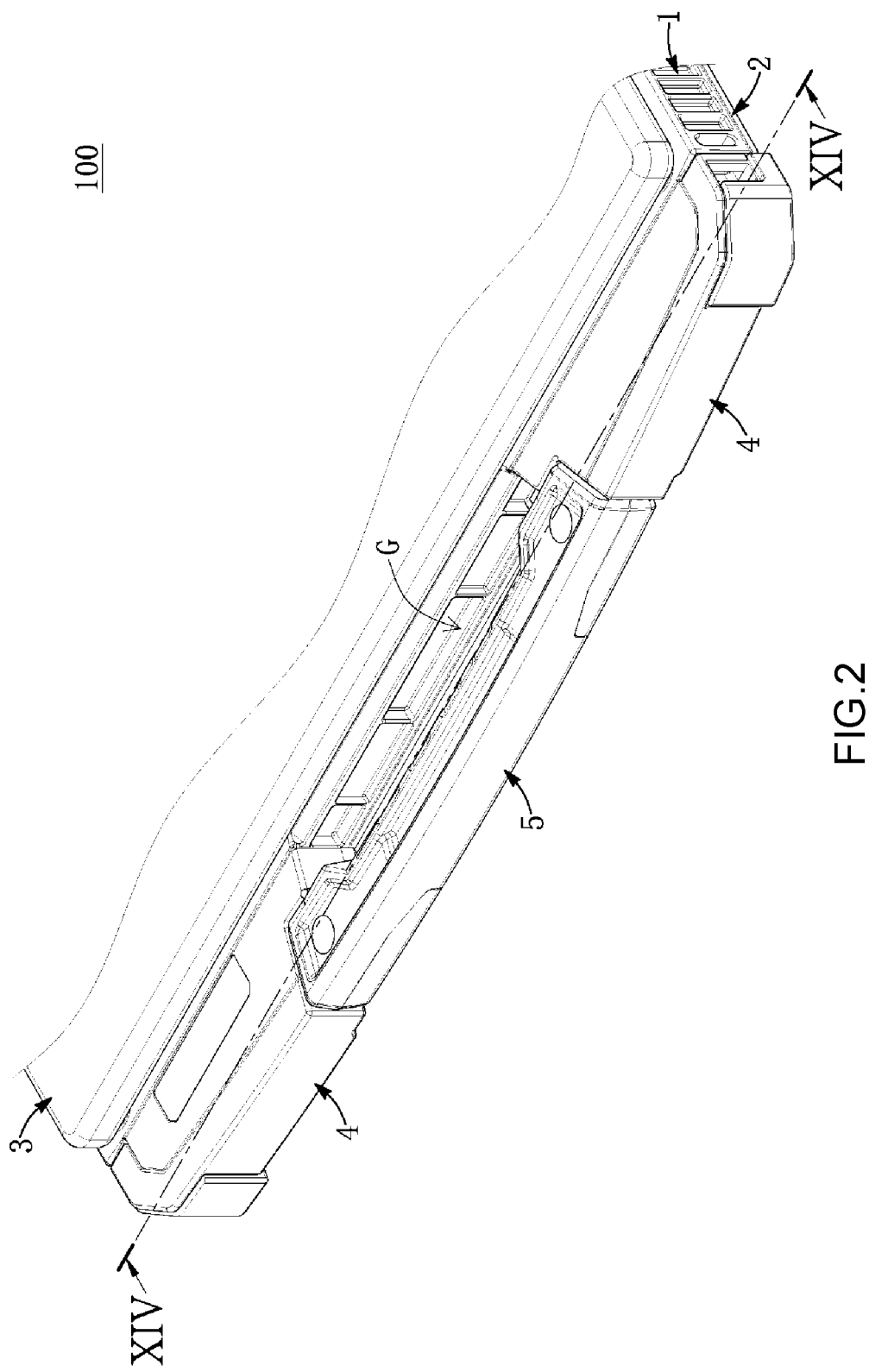
FIG. 2 is a partial enlarged view based on FIG. 1.
Figure 3:
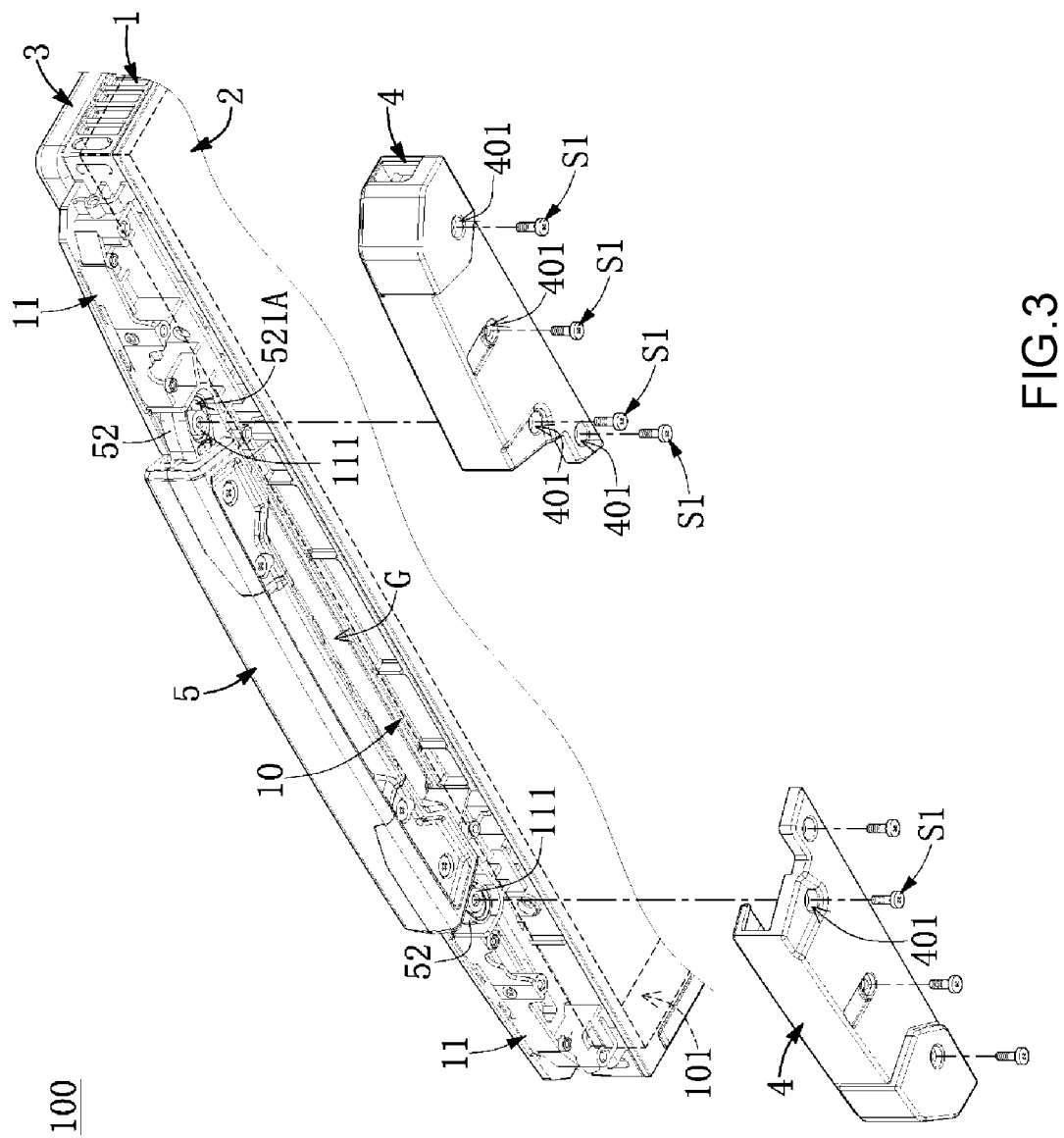
FIG. 3, FIG. 4 and FIG. 5 are partial exploded views of the portable electronic device of the present disclosure, showing a main body, two casings and a handle unit of the portable electronic device.
Figure 4:
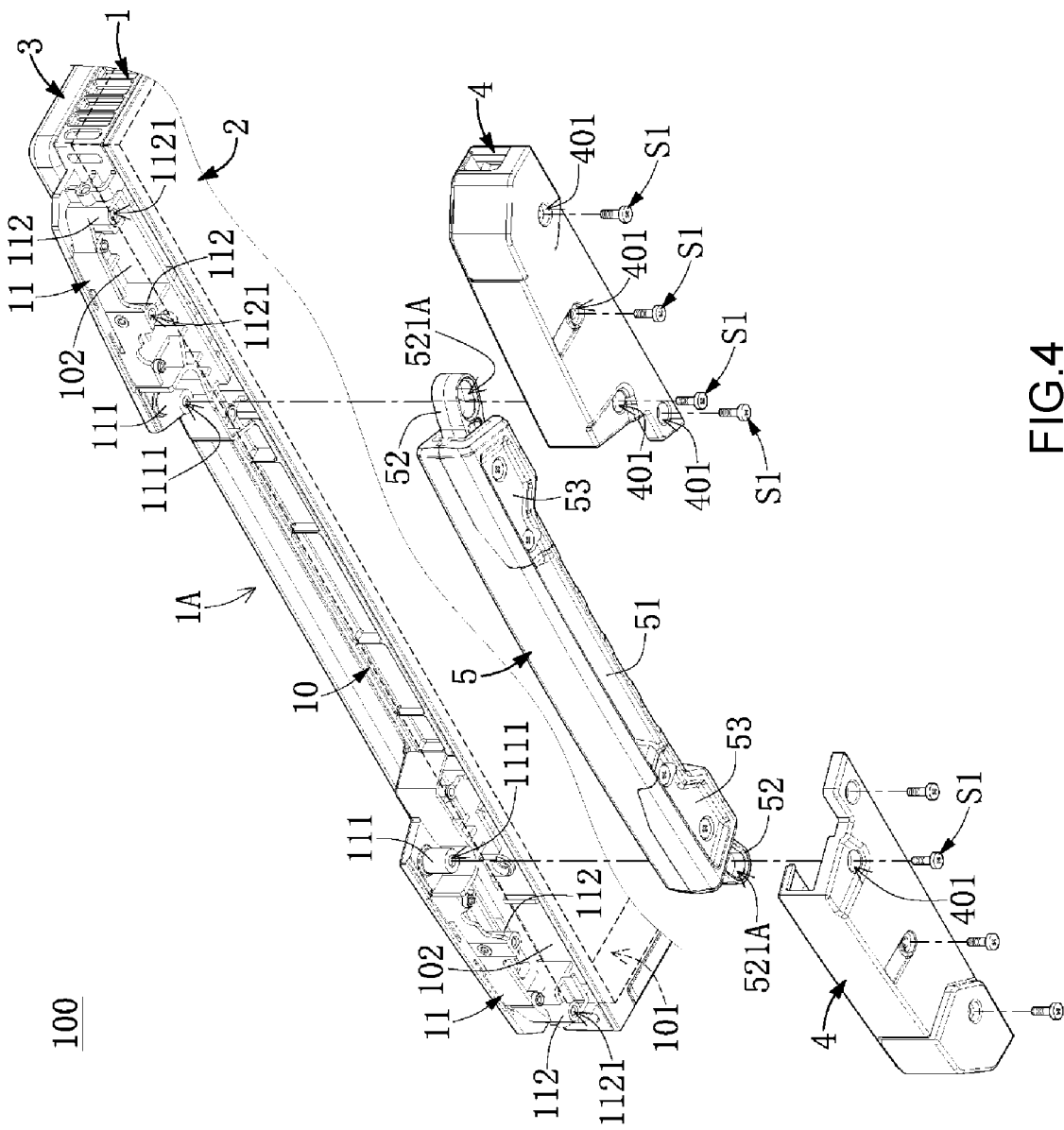
Figure 5:
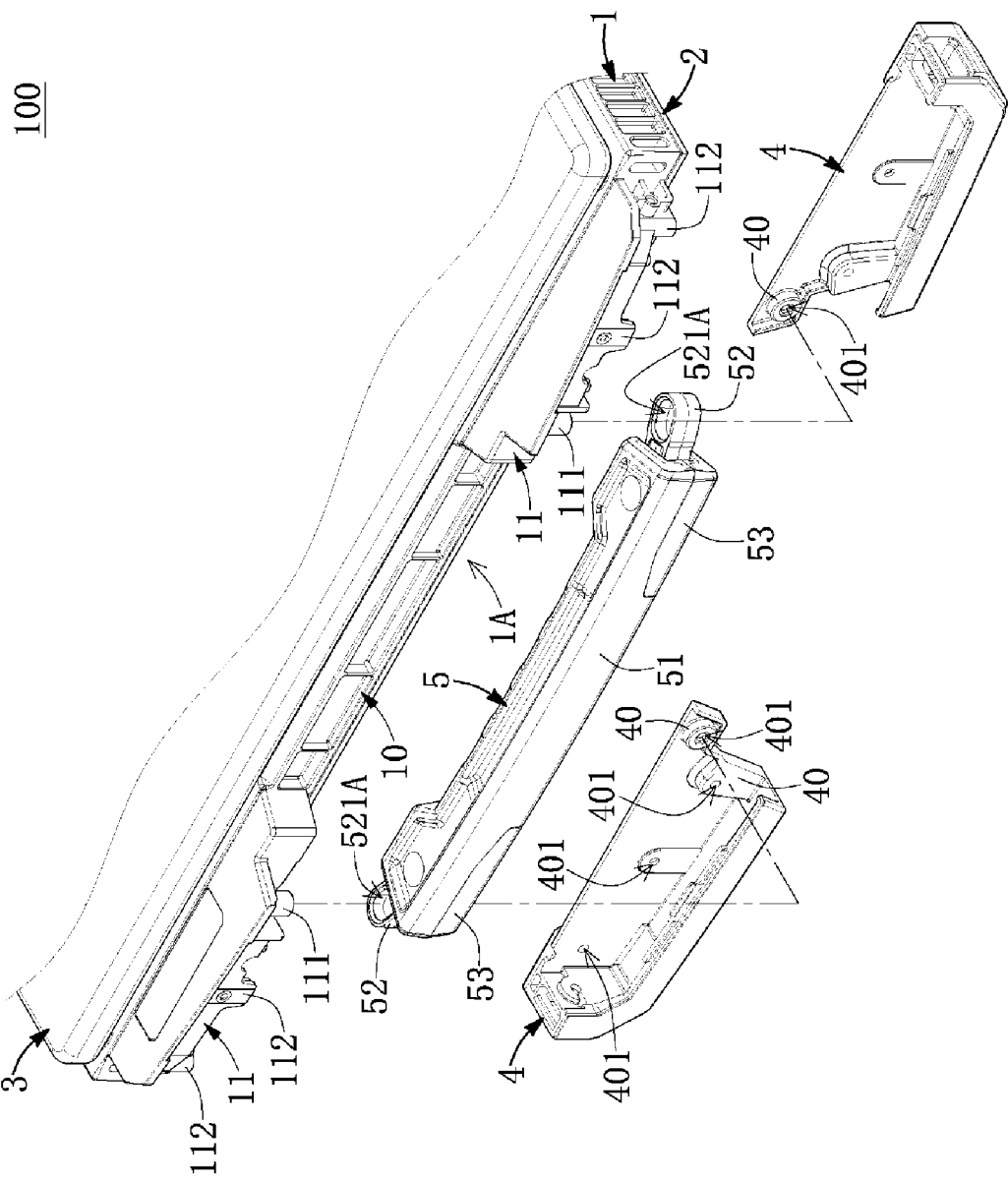

Refer to FIG. 1 through FIG. 5. FIG. 1 is a perspective view of a portable electronic device of the present disclosure. FIG. 2 is a partial enlarged view based on FIG. 1. FIG. 3 through FIG. 5 are partial exploded views of the portable electronic device of the present disclosure, showing a main body, two casings and a handle unit of the portable electronic device.

A portable electronic device 100 of the present disclosure comprises a main body 1, a bottom cover 2, a screen 3, two casings 4 and a handle unit 5. The portable electronic device 100 of the present disclosure is exemplified by a rugged laptop, but the present disclosure is not limited thereto. The main body 1 has therein electronic parts and components, such as a circuit board, various electrical connection ports, and various memories (such as a hard disk drive). The main body 1 is further provided with a keyboard and a touch panel. The two bottom covers 2 are demountably fixed to the main body 1. After the bottom covers 2 have been removed from the main body 1, electronic parts and components, such as a circuit board, various electrical connection ports, and various memories, disposed in the main body 1 are exposed. The screen 3 is movably disposed on one side of the main body 1. The two casings 4 are demountably disposed at two corners of the main body 1. The two casings 4 match the main body 1, such that the handle unit 5 is movably disposed on one side of the main body 1.

Referring to FIG. 3 through FIG. 5, the main body 1 has a board portion 10 and two extension portions 11. The board portion 10 extends laterally to form the two extension portions 11. The two extension portions 11 and the board portion 10 together define a recess 1A. The recess 1A is disposed on one side of the main body 1. The recess 1A receives the handle unit 5. In practice, the board portion 10 and the two extension portions 11 are integrally formed. A material which the main body 1 is made of must be appropriately selected to meet practical needs. For instance, the portable electronic device 100 in an embodiment of the present disclosure is exemplified by a rugged laptop, and the main body 1 is, for example, made of an aluminum-magnesium alloy.

A receiving chamber 101 is disposed at one end of the board portion 10. The receiving chamber 101 receives at least one circuit board (not shown). The two extension portions 11 are not in communication with the receiving chamber 101. A portion of a sidewall 102 of the receiving chamber 101 is defined between the board portion 10 and each extension portion 11. When the bottom covers 2 are fixed to one end of the main body 1, the receiving chamber 101 is concealed.

Figure 9:
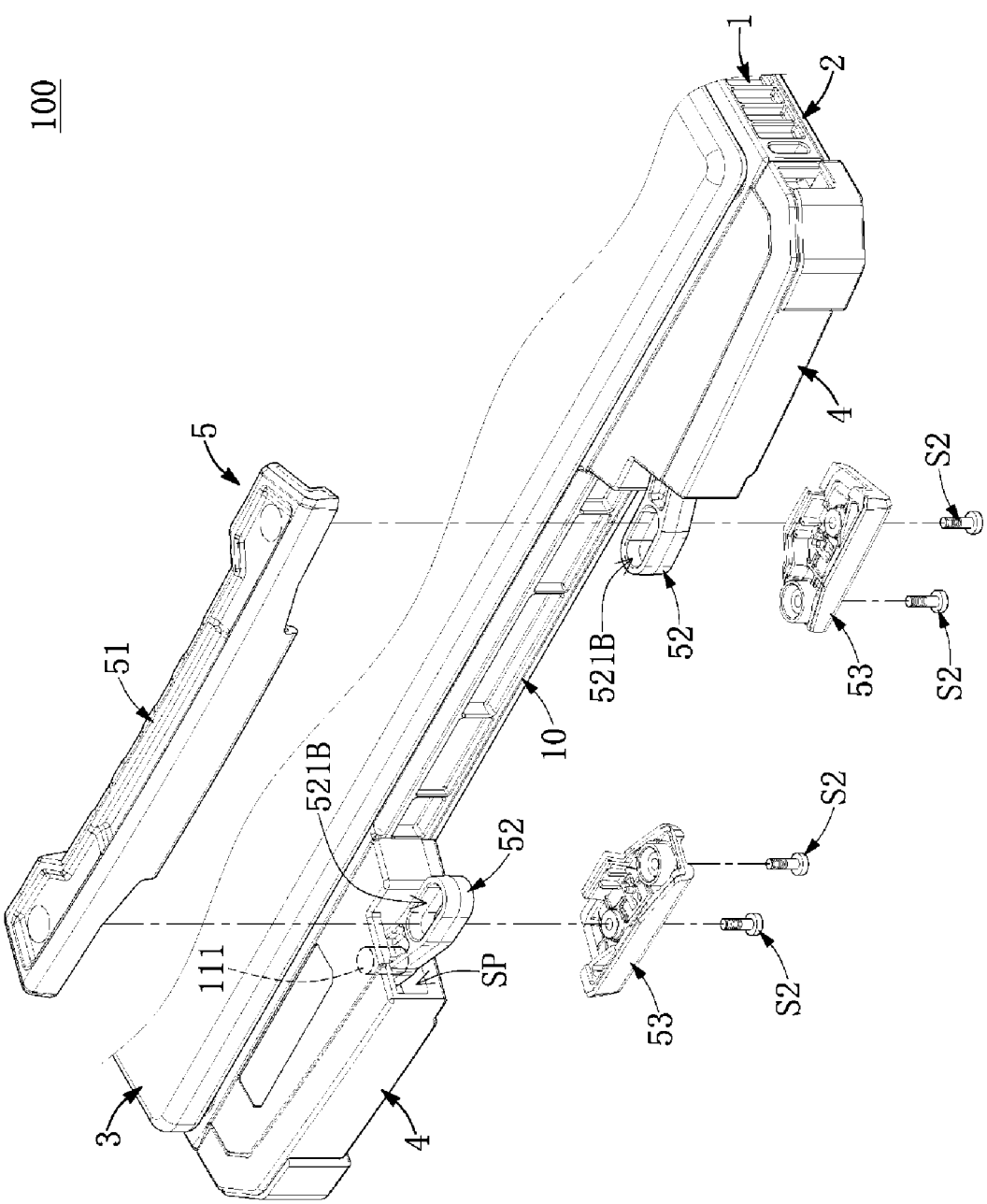
FIG. 9, FIG. 10 and FIG. 11 are partial exploded views of the handle unit at the shut position according to the present disclosure.
Figure 13:
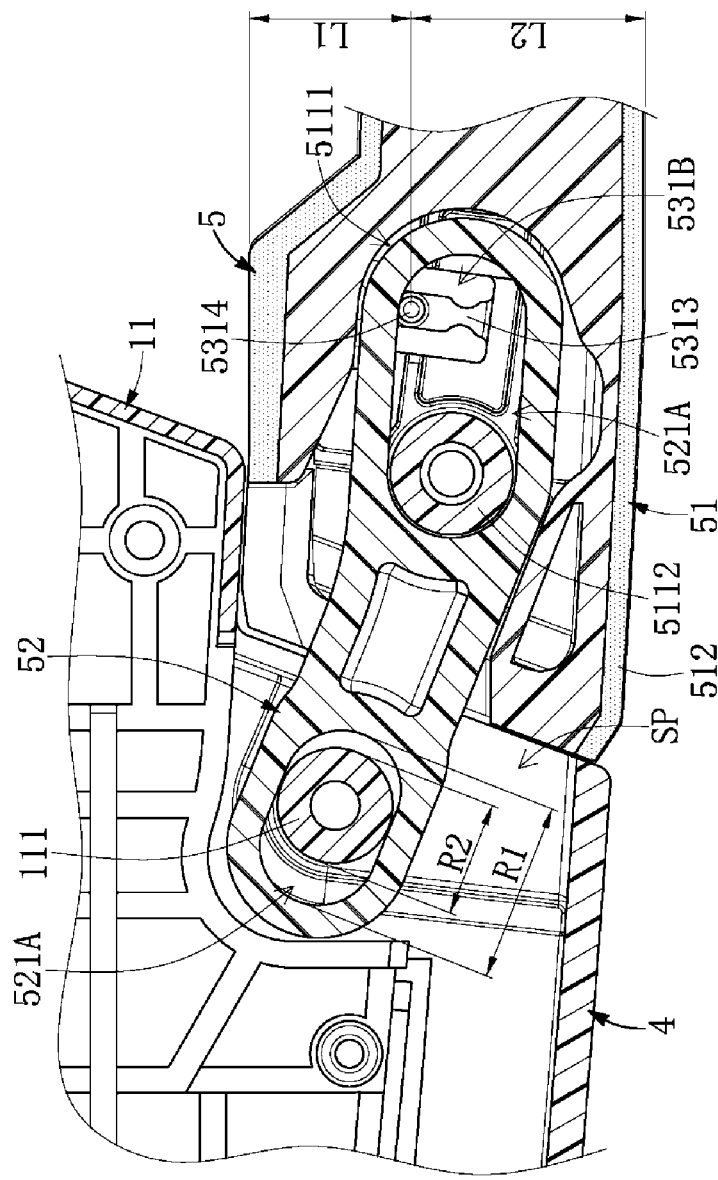
FIG. 13 is a partial cross-sectional view of the handle unit at the shut position according to the present disclosure.

Each extension portion 11 has a protruding post 111 and first fastening members 112. The protruding post 111 has a protruding post fastening hole 1111. Each first fastening member 112 has a first fastening hole 1121. The casings 4 each have second fastening members 40. Each second fastening member 40 has a second fastening hole 401. Screws S1 are engaged with and fixed to the protruding post fastening hole 1111 and the first fastening holes 1121 of each extension portion 11 and the second fastening holes 401 of the casings 4, respectively. Referring to FIG. 9 and FIG. 13, when the casings 4 are fixed to the extension portions 11 with the screws S1, the casings 4 and the extension portions 11 together define a movement space SP.

Referring to FIG. 3 through FIG. 6, the handle unit 5 comprises a gripping member 51 and two movement elements 52. The gripping member 51 is adapted to be gripped by a user. The two movement elements 52 are movably disposed at two ends of the gripping member 51, respectively. Two ends of each movement element 52 each have two guiding through holes, namely a first guiding through hole 521A and a second guiding through hole 521B. Each guiding through hole penetrates the movement element 52. One end of each movement element 52 is movably disposed at the gripping member 51. The other end of each movement element 52 is exposed from the gripping member 51, with the first guiding through hole 521A exposed from the gripping member 51.

The first guiding through hole 521A of each movement element 52 fits around the protruding post 111. Referring to FIG. 13, when the casings 4 are fixed to the extension portions 11, the first guiding through hole 521A of the movement element 52 fits around the protruding post 111. Diameter R1 of the first guiding through hole 521A of each movement element 52 is greater than outer diameter R2 of each protruding post 111. The movement elements 52 move within the movement space SP relative to the protruding post 111 whenever the gripping member 51 is operable to move relative to the main body 1.

Figure 15:
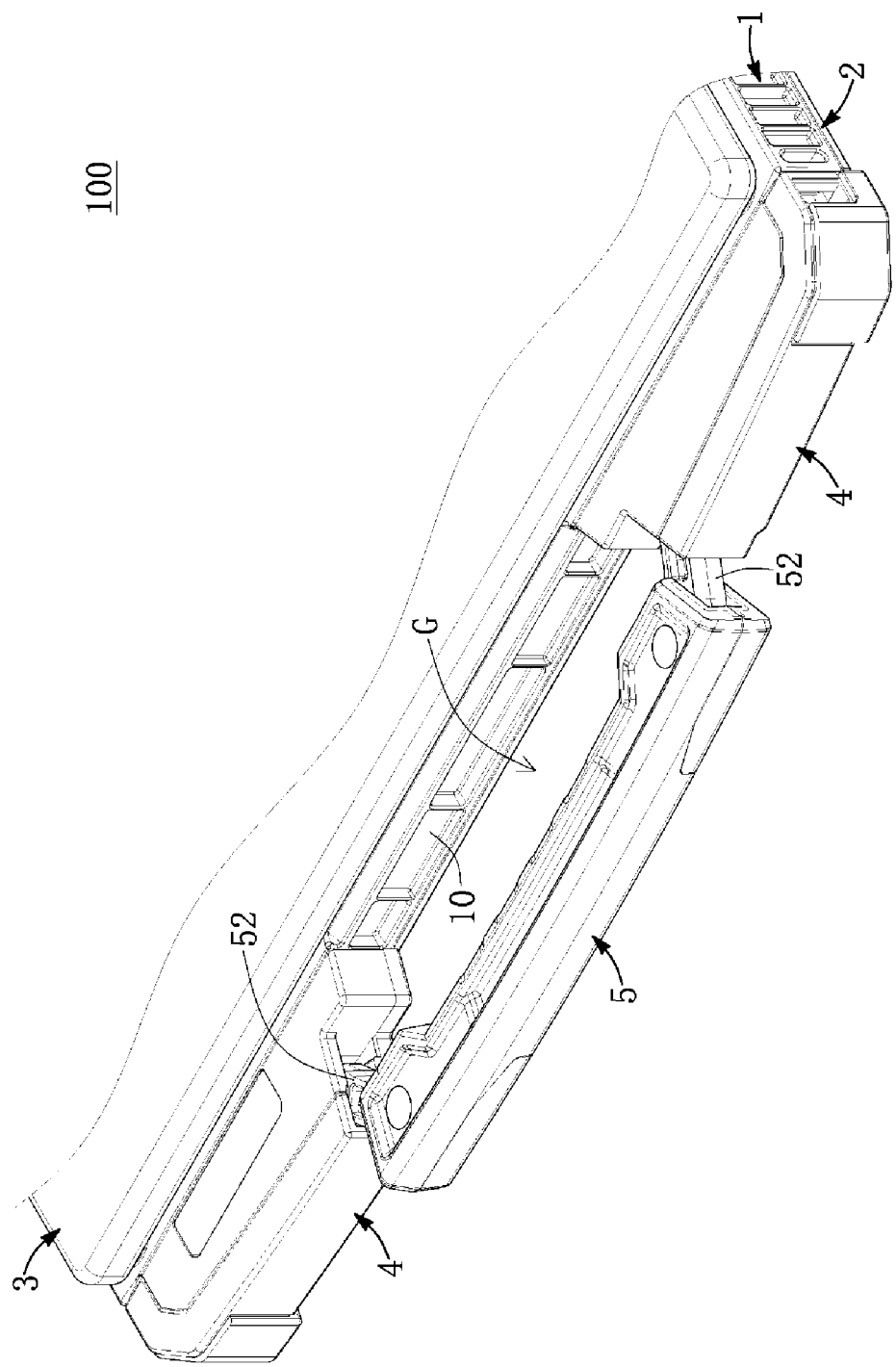
FIG. 15 is a schematic view of the handle unit at the opened position according to the present disclosure.
Figure 16:
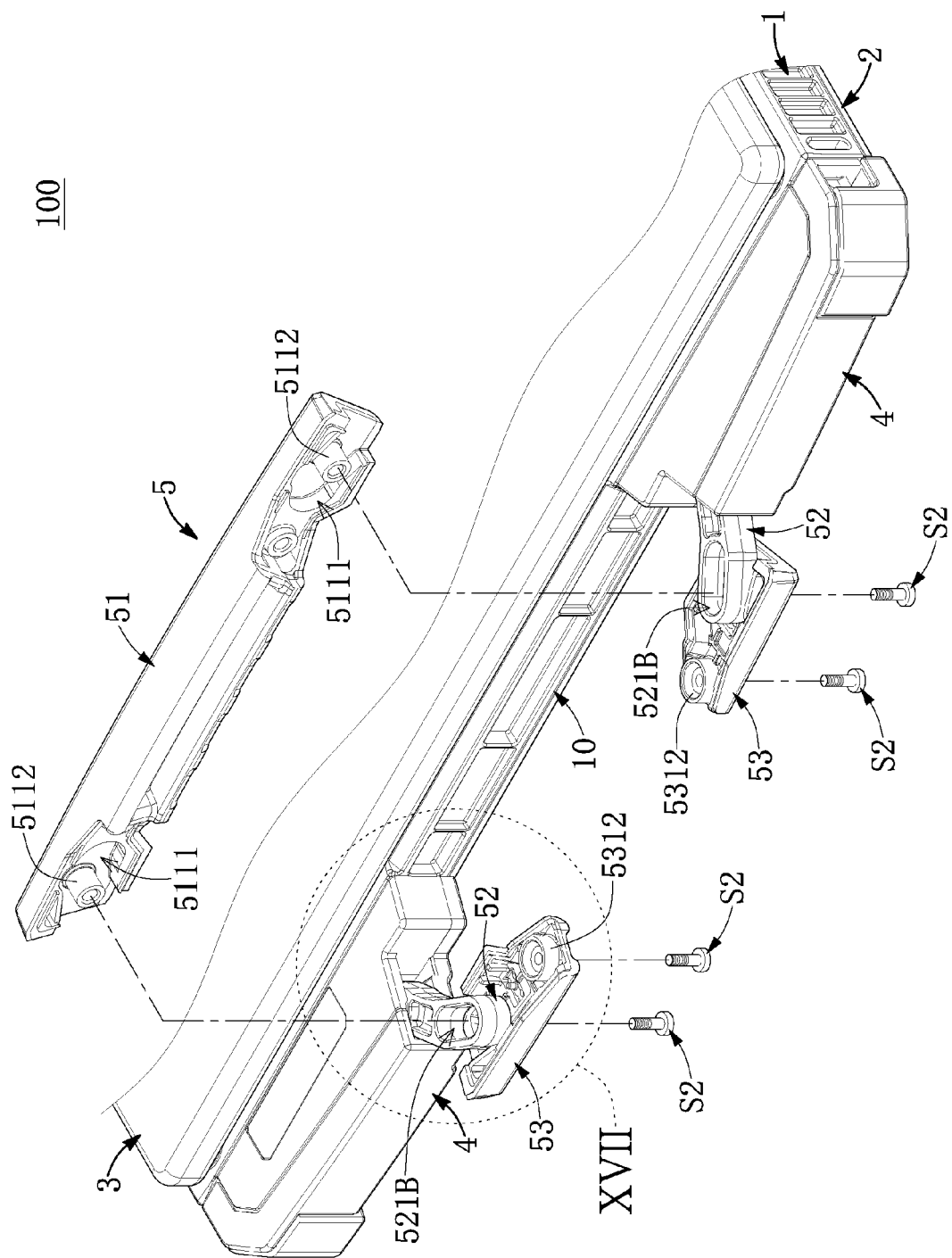
FIG. 16 is an exploded view of the handle unit at the opened position according to the present disclosure.
Figure 17:
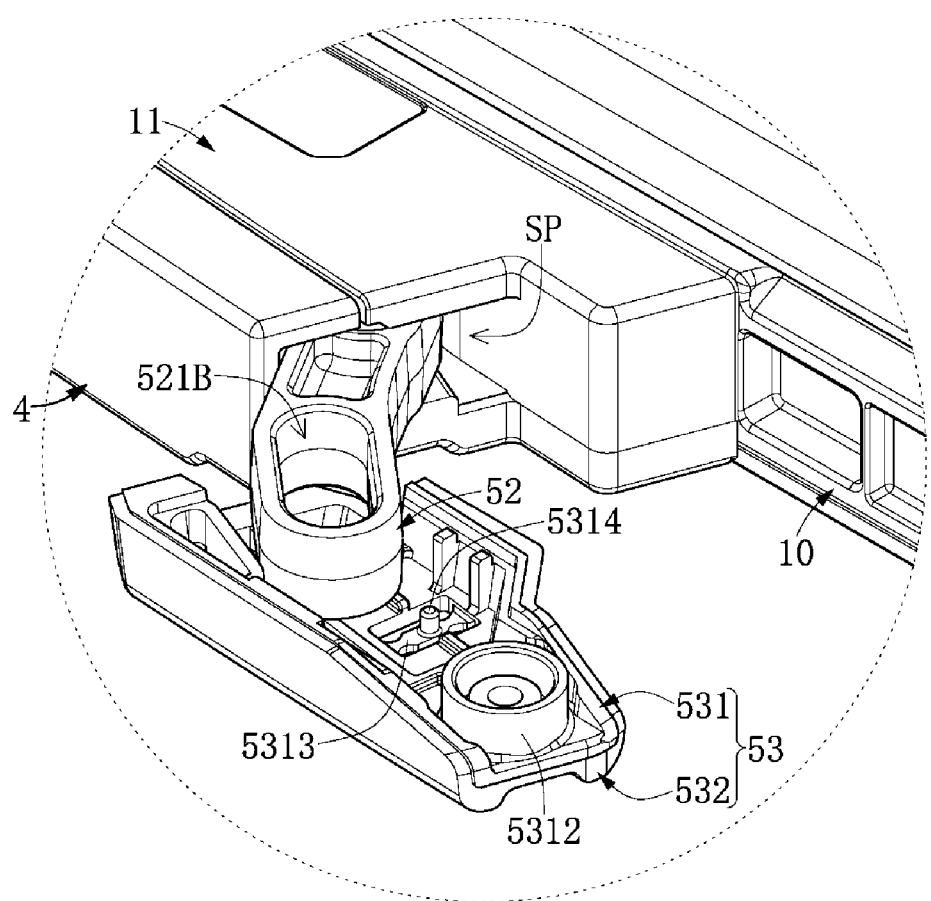
FIG. 17 is a cutaway view of the handle unit at the opened position according to the present disclosure.

Referring to FIG. 1, FIG. 2 and FIG. 15, the gripping member 51 is operable to move between an opened position (shown in FIG. 1 and FIG. 2) and a shut position (shown in FIG. 15) of the main body 1 because of the two movement elements 52. A gap G formed between the handle unit 5 and the main body 1 is wider when the handle unit 5 is at the opened position than at the shut position.

Referring to FIG. 3 and FIG. 4, with each said extension portion 11 not being in communication with the receiving chamber 101 of the board portion 10, no demounting process of the handle unit 5 affects the electronic parts and components disposed in the board portion 10, not only because the bottom covers 2 are fixed to the main body 1 but also because the bottom covers 2 conceal the receiving chamber 101. Therefore, a maintenance technician's changing the handle unit 5 simply entails removing the two casings 4 from the main body 1, and the receiving chamber 101 of the board portion 10 is not exposed in the course of changing the handle unit 5.

Since the handle unit 5 is fixed to the main body 1 through the two casings 4 and the screws S1, the changing process of the handle unit 5 merely entails removing the screws S1 to separate the casings 4 and the handle unit 5 from the main body 1. Mounting the two casings 4 on the handle unit 5 merely entails fitting the first guiding through hole 521A of the movement element 52 of the handle unit 5 around the protruding post 111 and then fastening the two casings 4 to the main body 1 with the screws S1.

According to the present disclosure, not only does the portable electronic device 100 comprise the main body 1, the two casings 4 and the handle unit 5 to render it easy to change the handle unit 5 whenever the handle unit 5 malfunctions, but the fact that the extension portions 11 are not in communication with the receiving chamber 101 of the board portion 10 minimizes the chance of damaging the parts and components in the board portion 10 in the course of changing the handle unit 5 and the chance of deteriorating the waterproofing and dustproofing capability of the board portion 10.

Figure 6:
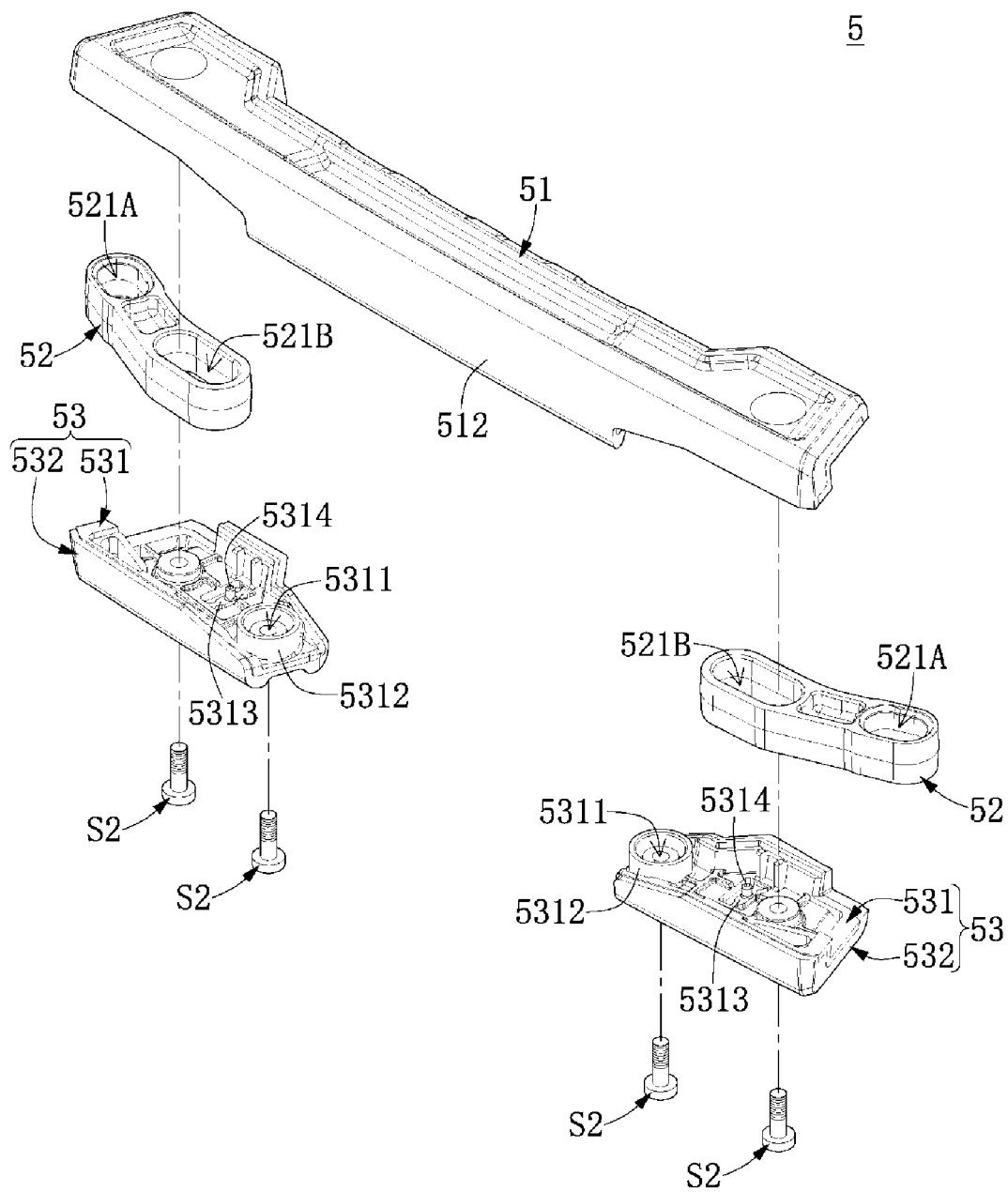
FIG. 6 and FIG. 7 are exploded views of the handle unit of the portable electronic device of the present disclosure.
Figure 7:
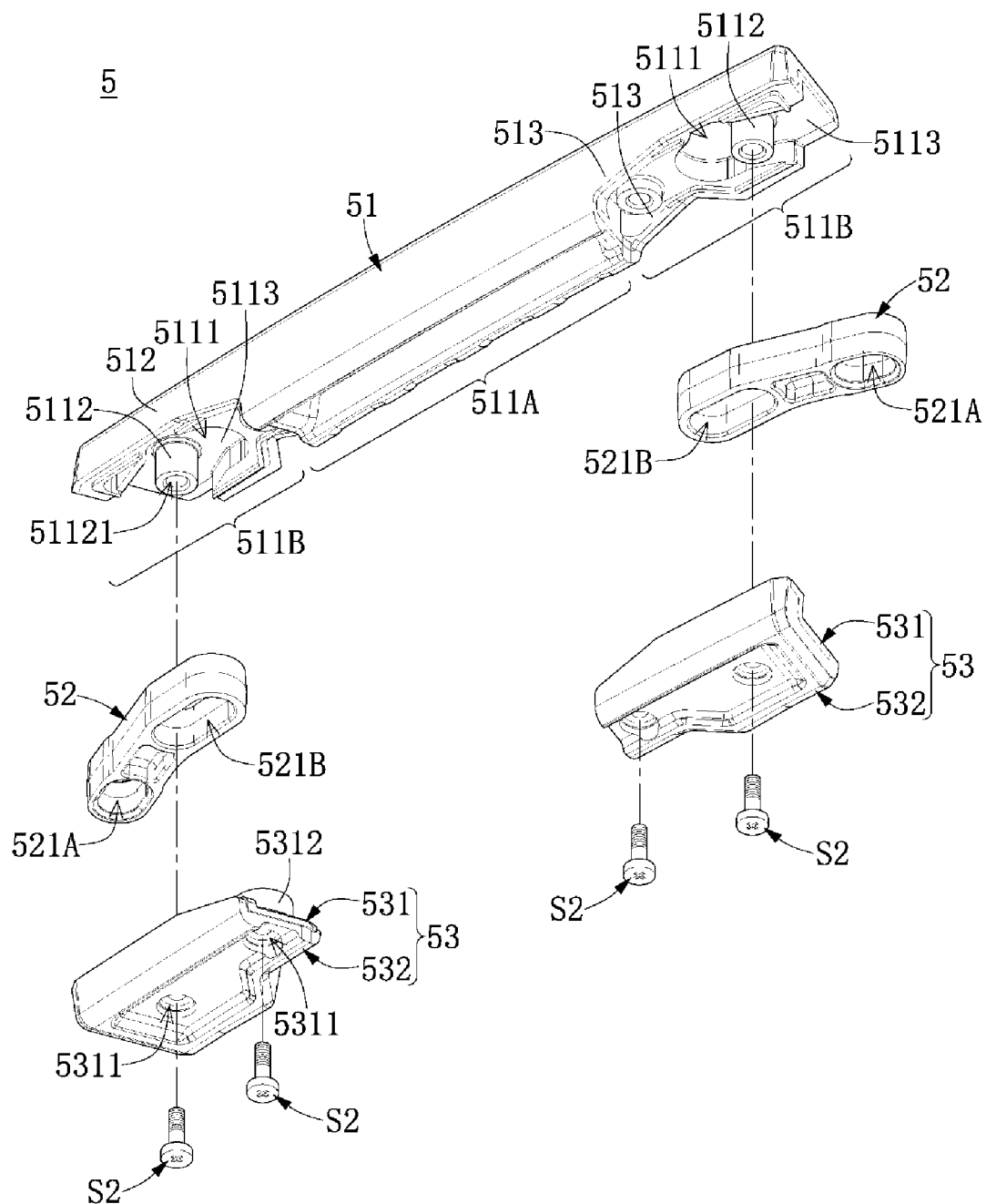
Figure 8:
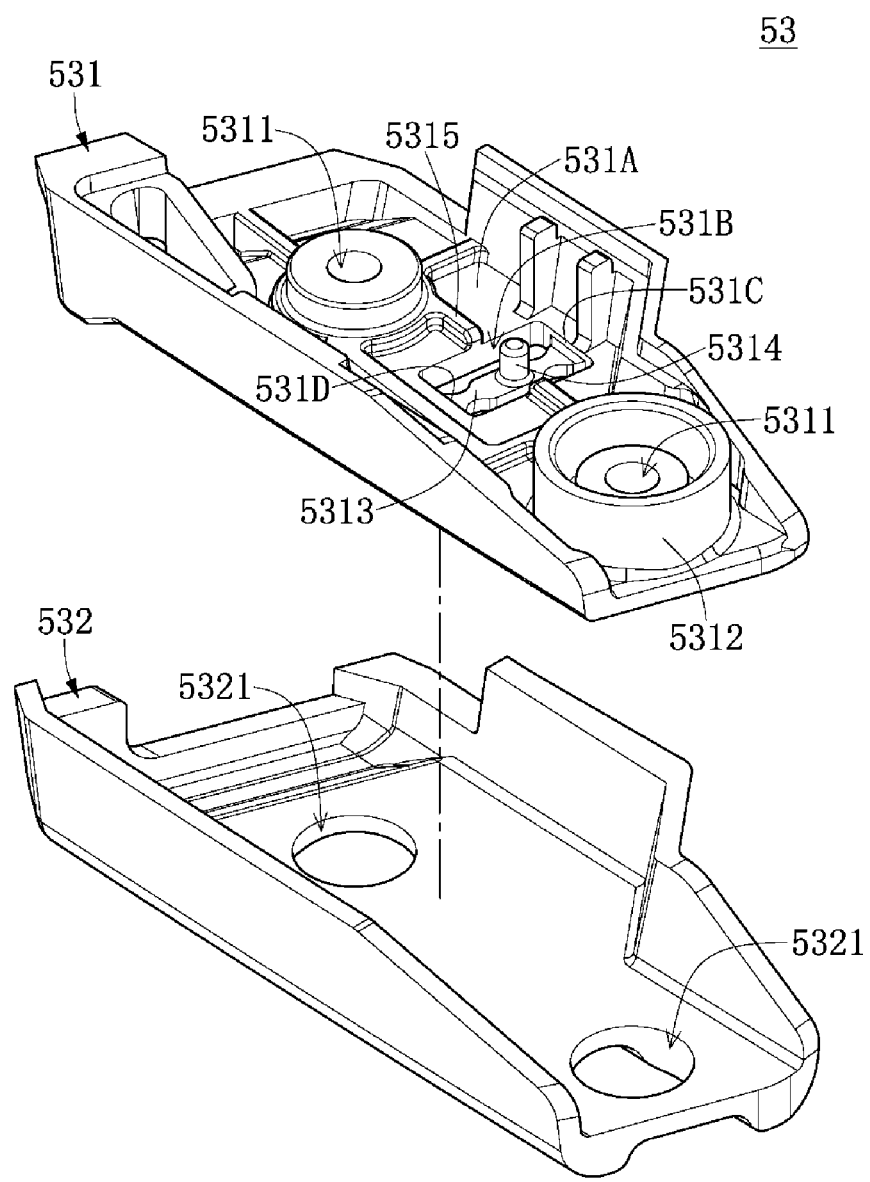
FIG. 8 is an exploded view of the handle cover of the portable electronic device of the present disclosure.
Figure 10:
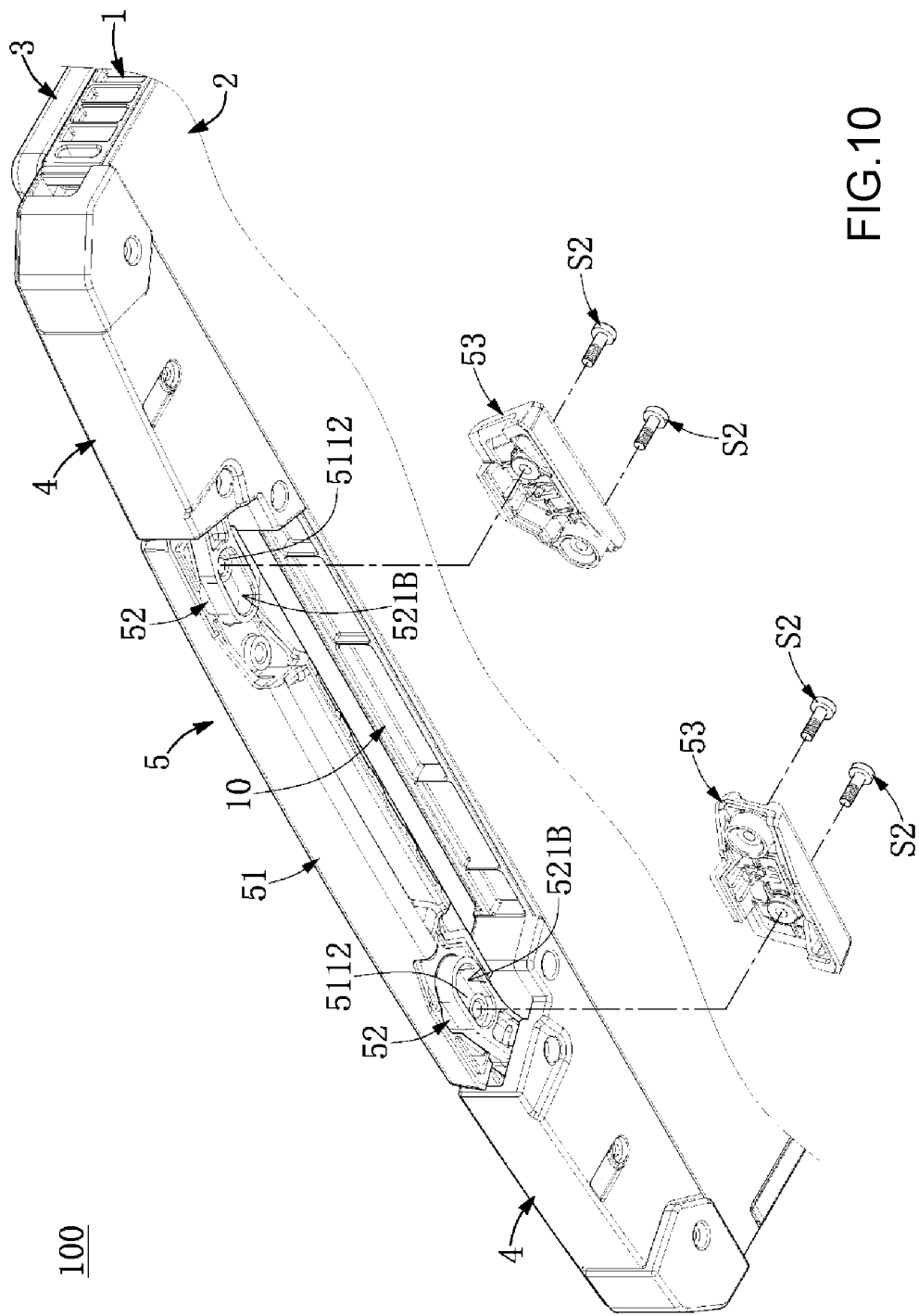
Figure 11:
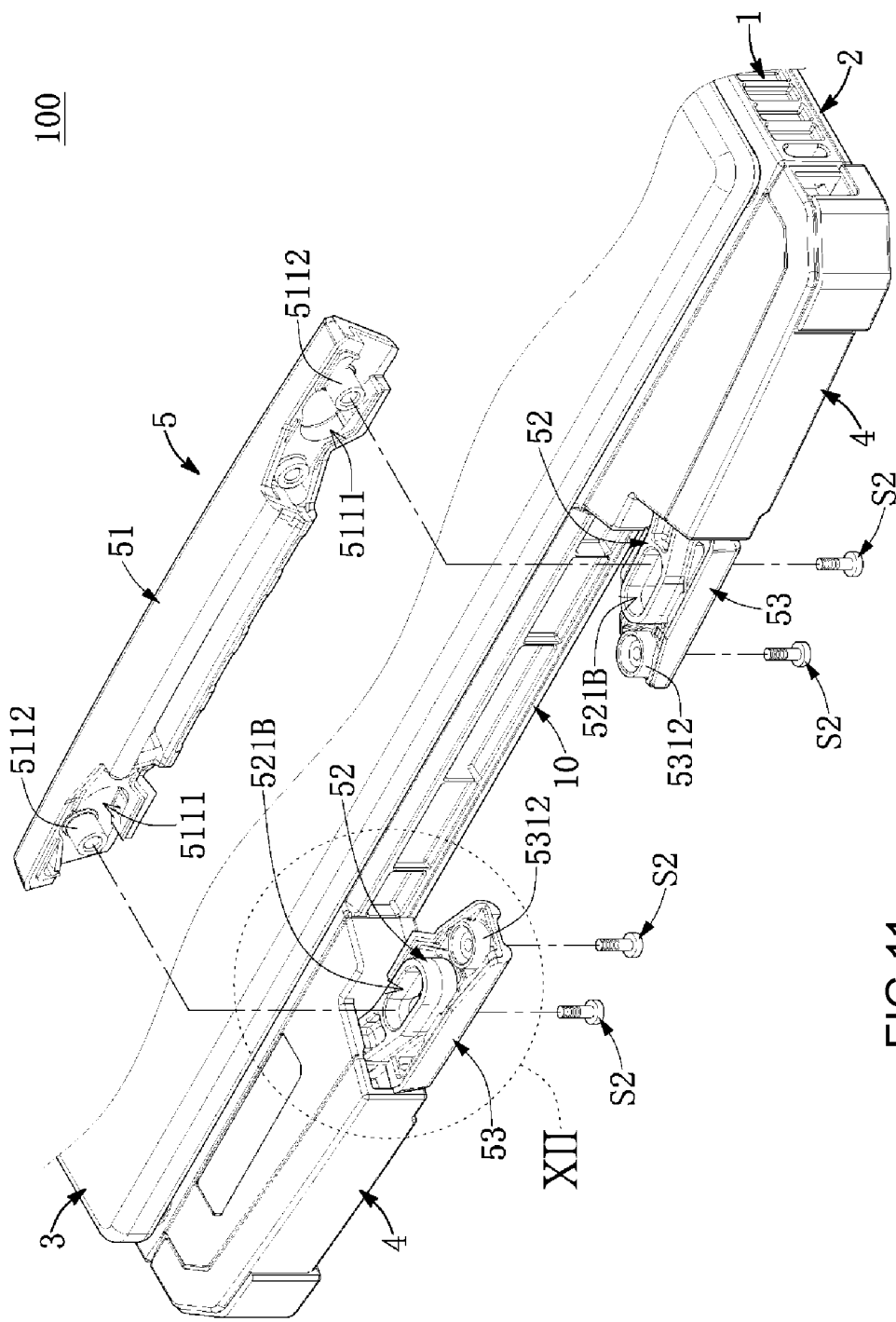
Figure 12:
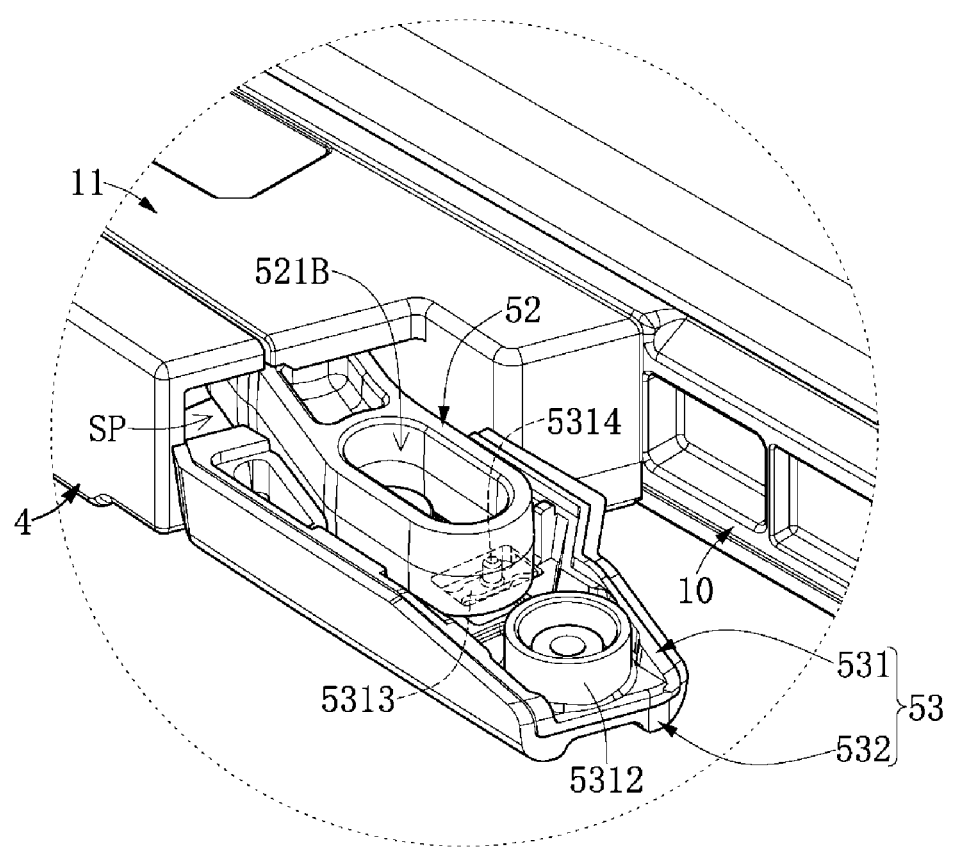
FIG. 12 is a cutaway view of the handle unit at the shut position according to the present disclosure.

Refer to FIG. 6 through FIG. 10. FIG. 6 and FIG. 7 are exploded views of the handle unit 5. FIG. 8 is an exploded view of the handle cover of the handle unit 5. FIG. 9 and FIG. 10 are exploded views of the handle unit 5 and the main body 1. Referring to FIG. 6 through FIG. 8, in practice, the handle unit 5 not only comprises the gripping member 51 and the two movement elements 52 but also comprises two handle covers 53.

The two handle covers 53 are demountably fixed to the two ends of the gripping member 51. Owing to the two handle covers 53, the end of the movement element 52, which has the second guiding through hole 521B, is movably fixed to the gripping member 51. In practice, each handle cover 53 is, for example, operable in conjunction with screws S2 and thus is demountably fixed to the gripping member 51.

The gripping member 51 comprises a structural body 511 and a resilient enclosure 512. The structural body 511 has a first portion 511A and two second portions 511B spaced apart from the first portion 511A. Two ends of the first portion 511A extend to form the second portions 511B, respectively; consequently, the first portion 511A is disposed between the two second portions 511B. The thickness of the first portion 511A is greater than the thickness of the second portions 511B. A step is formed at the junction of the first portion 511A and the second portions 511B. The first portion 511A serves as a major supportive means of supporting the gripping member 51. The two second portions 511B operate in conjunction with the two handle covers 53 and the screws S2, such that the two movement elements 52 are movably disposed at the two ends of the gripping member 51.

The two handle covers 53 are disposed on the two second portions 511B of the structural body 511, respectively. The first portion 511A of the structural body 511 is disposed between the two handle covers 53. The two seams formed between the structural body 511 and the two handle covers 53 are not connected, thereby rendering the handle unit 5 much less vulnerable to a fall.

A gripping guide groove 5111 is formed on the surface of each second portion 511B. The structural body 511 further has two gripping guiding posts 5112. The two gripping guiding posts 5112 are movably disposed at the two gripping guide grooves 5111. Each gripping guiding post 5112 protrudes upward from a bottom wall 5113 of the corresponding gripping guide groove 5111. The second guiding through hole 521B of each movement element 52 fits around the corresponding gripping guiding post 5112

In practice, two lateral reinforcement members 513 are disposed at the junctions of the first portion 511A and the two second portions 511B, respectively. The two lateral reinforcement members 513 render the gripping member 51 much less vulnerable to a fall. In a specific embodiment, each lateral reinforcement member 513 is a triangular plate, with the second portions 511B connected to a long side 5131 of each lateral reinforcement member 513, and the first portion 511A connected to a short side 5132 of each lateral reinforcement member 513. The ratio of the length of the short side 5132 to the length of the long side 5131 ranges from 1:1 to 1:5.

Each handle cover 53 comprises a handle cover body 531 and a resilient enclosure 532. The handle cover body 531 has two screw holes 5311, a handle cover guiding post 5312, a resilient arm 5313 and a positioning member 5314. The two screw holes 5311 of each handle cover body 531 match two screws S2, such that each handle cover body 531 is demountably fixed to one end of the gripping member 51. With the handle cover body 531 being fixed to one end of the gripping member 51 with the screws S2, the handle cover body 531 conceals the gripping guide grooves 5111. The screw holes 5311 of each handle cover body 531 are not necessarily in the number of two but are subject to changes as needed. The handle cover guiding post 5312 is disposed at one end of the handle cover body 531. The handle cover guiding post 5312 fits in the second guiding through hole 521B of the movement element 52.

The handle cover guiding post 5312 protrudes upward from a wide surface 531A of the handle cover body 531. The handle cover guiding post 5312 and the gripping guiding post 5112 together form a column C (shown in FIG. 14). The second guiding through hole 521B of the movement element 52 fits around the column C. In practice, one of the screw holes 5311 of the handle cover body 531 is formed in the handle cover guiding post 5312, whereas the gripping guiding post 5112 has therein one screw hole 51121. The positions of the screw holes 5311 of the handle cover body 531 are not restricted to the disclosure in the accompanying drawings but are subject to changes as needed. The gripping member 51 has screw holes corresponding in position to the screw holes 5311. The screws S2 match the screw holes of the gripping member 51 and the screw holes 5311 of the handle cover 53, respectively, such that the handle cover 53 is demountably fixed to the gripping member 51.

Figure 14:
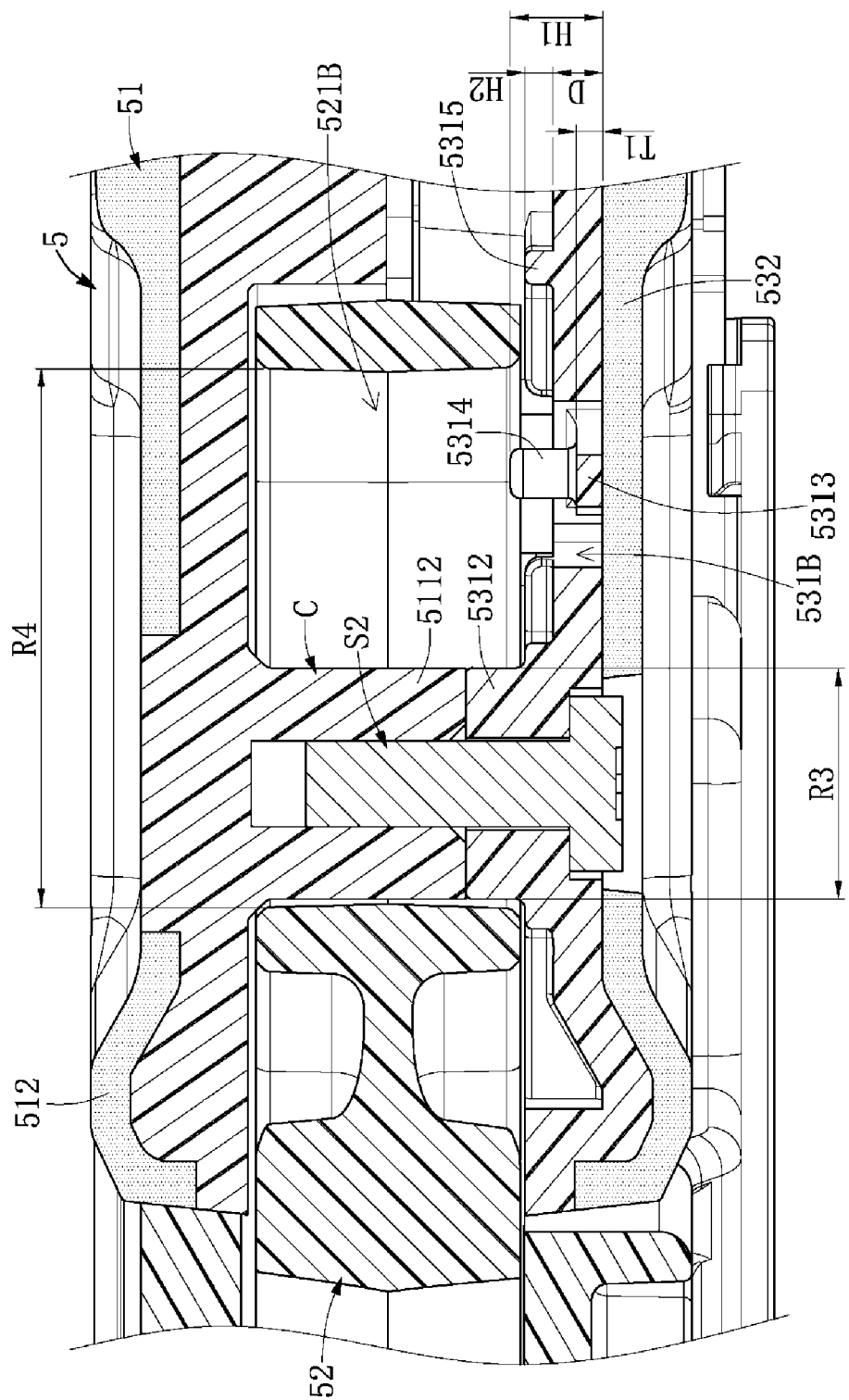
FIG. 14 is another partial cross-sectional view of the handle unit at the shut position according to the present disclosure.

Referring to FIG. 14, when the handle cover body 531 is fixed to the gripping member 51 with the screws S2, the gripping guiding post 5112 and the handle cover guiding post 5312 together form a column C, whereas the second guiding through hole 521B of the movement element 52 fits around the column C. Diameter R3 of the second guiding through hole 521B of the movement element 52 is greater than outer diameter R4 of the handle cover guiding post 5312. The column C moves within the second guiding through hole 521B in response to the movement of the movement element 52 relative to the gripping member 51.

Referring to FIG. 8, a through hole 531B is disposed on the wide surface 531A of the handle cover body 531 and penetrates the handle cover body 531. An inner sidewall 531C of the through hole 531B extends centripetally to form the resilient arm 5313. One end of the resilient arm 5313 is connected to another inner sidewall 531D of the through hole 531B. Therefore, the two ends of the resilient arm 5313 are connected to the two opposing inner sidewalls 531C, 531D of the through hole 531B, respectively.

The positioning member 5314 protrudes upward from the surface of the resilient arm 5313. For instance, the positioning member 5314 looks like a protruding post, but the present disclosure is not limited thereto. If the positioning member 5314 is pushed, the resilient arm 5313 will not only move but also resiliently deform in the direction away from the handle cover body 531. The resilient arm 5313 returns to its initial position (i.e., its position prior to the push) as soon as the positioning member 5314 is no longer pushed.

With the handle cover body 531 being fixed to one end of the gripping member 51, both the resilient arm 5313 and the positioning member 5314 are confined to the scope of movement of the movement elements 52 relative to the gripping member 51. When the movement elements 52 move relative to the gripping member 51, the movement elements 52 push the positioning member 5314, such that the positioning member 5314 causes the resilient arm 5313 to deform resiliently.

Referring to FIG. 6 through FIG. 8, each resilient enclosure 532 is fixedly disposed on one side of the corresponding handle cover body 531, whereas one end (opposite the positioning member 5314) of the resilient arm 5313 abuts against the resilient enclosure 532. When the positioning member 5314 is pushed, the resilient arm 5313 deforms resiliently in the direction of the resilient enclosure 532, and the resilient enclosure 532 is compressed by the resilient arm 5313 to thereby deform resiliently. When the positioning member 5314 is no longer pushed, both the resilient arm 5313 and the resilient enclosure 532 restore their pre-deformation states (i.e., their states prior to the resilient deformations). Therefore, after being pushed by the movement element 52, the positioning member 5314 causes the resilient arm 5313 and the resilient enclosure 532 to deform resiliently. When the positioning member 5314 is no longer pushed, the positioning member 5314, the resilient arm 5313 and the resilient enclosure 532 restore their initial states (i.e., their states prior to the push). Each resilient enclosure 532 corresponds in position to the screw holes 5311 and further has giving-way holes 5321. When the resilient enclosure 532 is fixed to one side of the handle cover body 531, the screw holes 5311 are exposed from the giving-way holes 5321. The resilient enclosure 532 reduces the deformation of the resilient arm 5313 and thus prolongs the service life of the resilient arm 5313.

Since each handle cover body 531 comprises the resilient arm 5313 and the positioning member 5314, the movement elements 52 push the positioning member 5314 while the user is moving the handle unit 5 from the shut position to the opened position, thereby allowing the user to intensely perceive that the handle unit 5 has already moved to the opened position. By contrast, the movement elements 52 push the positioning member 5314 while the user is moving the handle unit 5 from the opened position to the shut position, thereby allowing the user to intensely perceive that the handle unit 5 has already moved to the shut position. Since each handle cover body 531 comprises the resilient arm 5313 and the positioning member 5314, the handle unit 5 can not only undergo the least possible movement in order to have a tactile feel when operated but also refrain from jerking when not operated. The movement elements 52 push the positioning member 5314 regardless of whether the user is moving the handle unit 5 from the opened position to the shut position or moving the handle unit 5 from the shut position to the opened position, and thus the user can exert substantially the same amount of force to cause the handle unit 5 to switch between the shut position and the opened position.

Referring to FIG. 14, in a specific embodiment, the sum of thickness T1 of the resilient arm 5313 and height H1 of the positioning member 5314 is greater than depth D of the through hole 531B, that is, T1+H1>D. One end (opposite the resilient arm 5313) of the positioning member 5314 is higher than the wide surface 531A of the handle cover body 531 which forms therein the through hole 531B. A raised member 5315 protrudes from the wide surface 531A of the handle cover body 531. The movement elements 52 abut against a surface (opposite the wide surface 531A) of the raised member 5315. The sum of height H1 of the positioning member 5314 and thickness T1 of the resilient arm 5313 is greater than the sum of height H2 of the raised member 5315 relative to the wide surface 531A and depth D of the through hole 531B, that is, T1+H1>H2+D. The difference between the sum of height H1 of the positioning member 5314 and thickness T1 of the resilient arm 5313 and the sum of height H2 of the raised member 5315 relative to the wide surface 531A and depth D of the through hole 531B ranges from 0.2 mm to 1 mm, that is, 0.2 mm<(T1+H1)−(H2+D)<1 mm. In practice, thickness T1 of the resilient arm 5313 is less than depth D of the through hole 531B and ranges from 0.5 mm to 1.2 mm, such that the resilient arm 5313 readily deforms resiliently whenever the positioning member 5314 is pushed by the movement element 52.

In a variant embodiment, the handle cover body 531 dispenses with the raised member 5315, and the movement element 52 abuts against the wide surface 531A of the handle cover body 531 directly. Height H3 of the positioning member 5314 relative to the wide surface 531A ranges from 0.2 mm to 1.5 mm. Therefore, the movement elements 52 push the positioning member 5314 readily whenever the movement elements 52 move relative to the handle cover body 531.

Referring to FIG. 2, FIG. 10 through FIG. 14, when the handle unit 5 is at the shut position relative to the main body 1, the gripping guiding post 5112 abuts against one end of a sidewall of the second guiding through hole 521B, the movement elements 52 abut against sides of the gripping guide grooves 5111, and the positioning member 5314 abuts against a sidewall of the second guiding through hole 521B. Since the positioning member 5314 is positioned in the second guiding through hole 521B, the gripping member 51 will be unlikely to move relative to the main body 1 if it is not pulled by the user.

Referring to FIG. 13, in a cross-sectional top view of the handle unit 5 and the main body 1, distance L1 between the positioning member 5314 and a gripping inner side 51A of the gripping member 51 is less than distance L2 between the positioning member 5314 and a gripping outer side 51B of the gripping member 51; thus, the gripping member 51 is near one side of the gripping member 51, and the one side of the gripping member 51 is positioned proximate to the main body 1. Therefore, when the handle unit 5 is at the shut position relative to the main body 1, not only is the handle unit 5 restrained by the positioning member 5314, but the handle unit 5 is also unlikely to move relative to the main body 1 in the absence of any applied force.

Referring to FIG. 15 through FIG. 18, when the handle unit 5 is at the opened position relative to the main body 1, the gripping guiding post 5112 abuts against the other end of a sidewall of the second guiding through hole 521B, the movement elements 52 abut against the other sides of the gripping guide grooves 5111, and the positioning member 5314 is positioned outside the second guiding through hole 521B. In practice, the shape and length of the movement elements 52 are subject to changes as needed and thus are not restricted to the disclosure in the accompanying drawings. The width of the gap G formed between the handle unit 5 and the main body 1 when the handle unit 5 is at the opened position can be varied by varying the shape and length of the movement elements 52.

Figure 18:
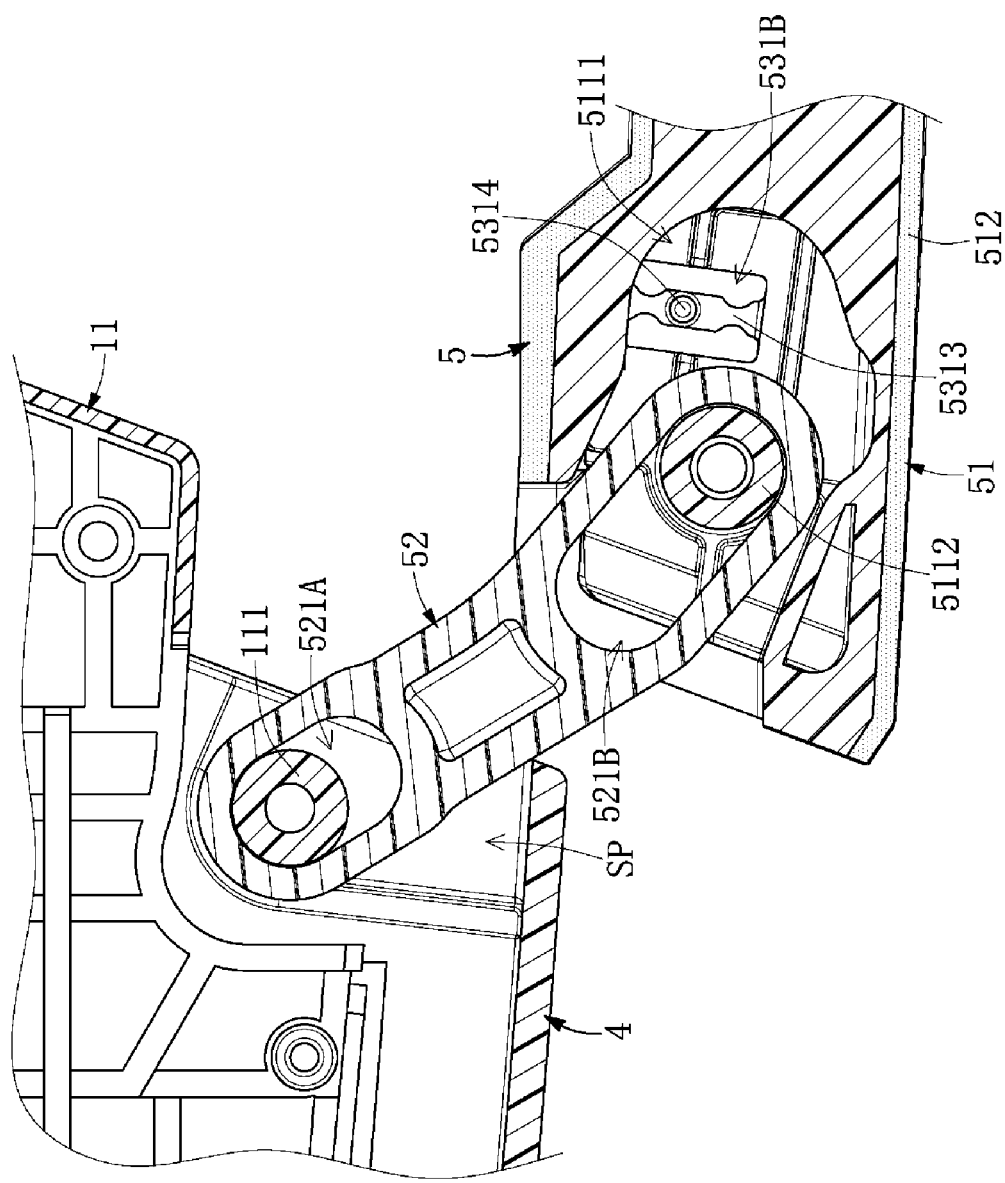
FIG. 18 is a partial cross-sectional view of the handle unit at the opened position according to the present disclosure.

Referring to FIG. 13 and FIG. 18, in the course of the movement of the handle unit 5 between the shut position and the opened position relative to the main body 1, not only do the movement elements 52 move along sidewalls of the gripping guide grooves 5111, but the scope and path of the movement of the movement elements 52 relative to the gripping member 51 are also guided and restricted by the gripping guide grooves 5111. In practice, the shape of the gripping guide grooves 5111 is subject to changes as needed and thus is not restricted to the disclosure in the accompanying drawings.

In conclusion, a portable electronic device of the present disclosure comprises a main body, two casings and a handle unit, and the main body comprises a board portion and two extension portions, allowing a user to change the handle unit whenever the handle unit malfunctions. With the extension portions being not in communication with a receiving chamber of the board portion, a circuit board disposed in the board portion and related electronic parts and components are not exposed while the user is changing the handle unit, nor are the electronic parts and components likely to be damaged. The portable electronic device of the present disclosure further comprises a gripping member and two handle covers each comprising a resilient arm and a positioning member. The user operates the handle unit to cause the handle unit to move between a shut position and an opened position relative to the main body. Since the positioning members move out of guiding through holes, the user intensely perceives that the handle unit has already moved from the shut position to the opened position. By contrast, the user operates the handle unit to cause the handle unit to move from the opened position to the shut position, such that the user intensely perceives that the handle unit has already moved to the shut position. The positioning members are disposed inside the guiding through holes of the movement elements when the handle unit is at the shut position; consequently, unless the user operates the handle unit, the handle unit will not move or jerk relative to the main body when the handle unit is at the shut position.

The present disclosure is disclosed above by preferred embodiments. However, persons skilled in the art should understand that the preferred embodiments are illustrative of the present disclosure only, but shall not be interpreted as restrictive of the scope of the claims of the present disclosure. Hence, all equivalent changes made to the aforesaid embodiments shall fall within the scope of the present disclosure. Accordingly, the legal protection for the present disclosure shall be defined by the appended claims.

What is claimed is:

1. A portable electronic device, comprising:
a main body comprising a board portion and two extension portions, the board portion extending laterally to form two said extension portions, each said extension portion having a protruding post, wherein two said extension portions and the board portion together define a recess;
two casings demountably fixed to two said extension portions, wherein the casings and the extension portions together define a movement space, and the protruding post is disposed in the movement space; and
a handle unit disposed in the recess, the handle unit comprising:
a gripping member adapted to be gripped by a user; and
two movement elements movably disposed at two ends of the gripping member and each having at least one guiding through hole, with the guiding through holes penetrating the movement elements and fitting around columns, respectively,
wherein the gripping member is operable to switch between an opened position and a shut position relative to the main body because of two said movement elements, and a gap formed between the handle unit and the main body is wider when the handle unit is at the opened position than at the shut position; and
wherein each said movement element has a first guiding through hole and a second guiding through hole, with the protruding post penetratingly disposed at the first guiding through hole, and each said handle unit further comprises:
two handle covers, each comprising:
a handle cover body having a through hole penetrating therethrough;
a handle cover guiding post protruding from a surface of the handle cover body, wherein the handle cover guiding post is penetratingly disposed at the second guiding through hole and moves within the second guiding through hole whenever the handle unit moves between the opened position and the shut position;
a resilient arm disposed at the handle cover body, wherein the resilient arm extends between and connects opposite sides of the through hole penetrating the handle cover;
a positioning member protruding from the resilient arm,
wherein the positioning member is positioned inside the guiding through hole when the handle unit is at the shut position relative to the main body and outside the guiding through hole when the handle unit is at the opened position relative to the main body,
wherein during the movement of the handle unit from the shut position to the opened position, the movement elements push the positioning member, and the resilient arm deforms resiliently, thereby allowing the positioning member to move out of the second guiding through hole and beyond the movement elements,
wherein during the movement of the handle unit from the opened position to the shut position, the movement elements push the positioning member, and the resilient arm deforms resiliently, thereby allowing the positioning member to move from beyond the movement elements into the second guiding through hole.

2. The portable electronic device of claim 1, further comprising a bottom cover, wherein the board portion has a receiving chamber for receiving at least one circuit board, the extension portions are not in communication with the receiving chamber, a portion of a sidewall of the receiving chamber is defined between the board portion and each said extension portion, and the bottom cover is demountably fixed to the main body to conceal the receiving chamber.

3. The portable electronic device of claim 1, wherein the handle unit further comprises two resilient enclosures laterally fixedly disposed on the handle cover bodies, respectively, an end of each said resilient arm abuts against the corresponding resilient enclosure, wherein the end of each said resilient arm is opposite the corresponding positioning member, wherein, when the positioning members are pushed, the resilient arms deform resiliently in the direction of the resilient enclosures, and the resilient enclosures are compressed by the resilient arms to thereby deform resiliently, wherein the resilient arms and the resilient enclosures restore their pre-deformation states whenever the positioning members are no longer pushed.

4. The portable electronic device of claim 1, wherein the through hole is formed on a wide surface of the handle cover, and an inner sidewall of the through hole extends centripetally to form the resilient arm in such a manner to allow two ends of the resilient arm to connect to two opposing inner lateral surfaces of the through hole, respectively, wherein a lateral surface of the resilient arm extends in the direction away from the through hole to from the positioning member, wherein the sum of the thickness of the resilient arm and the height of the positioning member is greater than the depth of the through hole, wherein a terminal end of the positioning member is higher than the wide surface, the terminal end being opposite the resilient arm.

5. The portable electronic device of claim 4, wherein a raised member protrudes from the wide surface of the handle cover body, and the movement elements abut against a side of the raised member, wherein the sum of the height of the positioning member and the thickness of the resilient arm is greater than the sum of the height of the raised member relative to the wide surface and the depth of the through hole.

6. The portable electronic device of claim 4, wherein the difference between the sum of the height of the positioning member and the thickness of the resilient arm and the sum of the height of the raised member relative to the wide surface and the depth of the through hole ranges from 0.2 mm to 1 mm.

7. The portable electronic device of claim 4, wherein the thickness of the resilient arm is less than the depth of the through hole.

8. The portable electronic device of claim 4, wherein the height of the positioning member relative to the wide surface ranges from 0.2 mm to 1.5 mm.

9. The portable electronic device of claim 1, wherein a gripping guide groove is formed on a surface of the gripping member, and the gripping member has a gripping guiding post, with the gripping guiding post disposed in the gripping guide groove, wherein, when the movement elements move relative to the gripping member, the movement elements move along the gripping guide groove, and the gripping guiding post moves relative to the guiding through hole.

10. The portable electronic device of claim 8, wherein the gripping member comprises a structural body having a first portion and two second portions, wherein two ends of the first portion extend to form the second portions, respectively, wherein the thickness of the first portion is greater than the thickness of the second portions, wherein a gripping guide groove and a gripping guiding post are disposed at each said second portion, wherein two lateral reinforcement members are disposed between the first portion and the second portions.

11. The portable electronic device of claim 8, wherein each said lateral reinforcement member is a triangular plate, with the second portions connected to a long side of each said lateral reinforcement member, and the first portion connected to a short side of each said lateral reinforcement member, and the ratio of the length of the short side to the length of the long side ranges from 1:1 to 1:5.

12. A portable electronic device, comprising:
a main body;
a handle unit comprising:
a gripping member having two ends each having a gripping guide groove, wherein the gripping member comprises two gripping guiding posts disposed in two said gripping guide grooves, respectively;
two movement elements each having two ends, each said end having a first guiding through hole and a second guiding through hole, the first guiding through hole fitting around a protruding post of the main body, the second guiding through hole fitting around one of the gripping guiding posts, wherein an end of each said movement element moves relative to the main body, and another end of each said movement element moves relative to the gripping member; and
two handle covers fixedly disposed at two ends of the gripping member and adapted to conceal two said gripping guide grooves, each said handle cover comprising:
a resilient arm; and
a positioning member protruding from a surface of the resilient arm,
wherein the handle unit is operable to move between an opened position and a shut position relative to the main body,
wherein, the positioning member is positioned outside the second guiding through hole when the handle unit is at the opened position, and the positioning member is positioned inside the second guiding through hole when the handle unit is at the shut position,
wherein, in the course of the handle unit being operable to move from the opened position to the shut position, the gripping guiding posts move relative to the movement elements, whereas the movement elements push the positioning member to thereby cause the resilient arm to deform, thereby allowing the positioning member to move into the second guiding through hole,
wherein, in the course of the handle unit being operable to move from the shut position to the opened position, the gripping guiding posts move relative to the movement elements, whereas the movement elements push the positioning member to thereby cause the resilient arm to deform, thereby allowing the positioning member to move out of the second guiding through hole; and
wherein the handle cover has a handle cover body, with a through hole penetrating a wide surface of the handle cover body, wherein an inner sidewall of the through hole extends between and connects opposite sides of the through hole penetrating the handle cover to form the resilient arm in such a manner to allow a lateral surface of the resilient arm to extend in the direction away from the through hole so as to form the positioning member, and a terminal end of the positioning member is higher than the through hole, wherein the terminal end is opposite the resilient arm, wherein a raised member protrudes from the wide surface of the handle cover body, and the height of the raised member relative to the wide surface is less than the height of the terminal end relative to the wide surface, wherein the movement elements abut against a surface of the raised member.

13. The portable electronic device of claim 12, wherein the sum of the thickness of the resilient arm and the height of the positioning member is less than the depth of the through hole.

14. The portable electronic device of claim 12, wherein the handle unit further comprises two resilient enclosures, with each said resilient enclosure fixedly disposed on a side of the corresponding handle cover body, wherein a side of each said resilient arm abuts against the corresponding resilient enclosure, the side being opposite the positioning member, wherein, when the positioning member is pushed, the resilient arms deform resiliently in the direction of the resilient enclosures, whereas the resilient enclosures are compressed by the resilient arms to thereby deform resiliently, wherein the resilient arms and the resilient enclosures restore their pre-deformation states whenever the positioning member is no longer pushed.

\* \* \* \* \*